United States Patent
Brar

(10) Patent No.: US 8,043,910 B2
(45) Date of Patent: Oct. 25, 2011

(54) INTEGRATED SEMICONDUCTOR STRUCTURE INCLUDING A HETEROJUNCTION BIPOLAR TRANSISTOR AND A SCHOTTKY DIODE

(75) Inventor: Berinder P. S. Brar, Newbury Park, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 12/789,498

(22) Filed: May 28, 2010

(65) Prior Publication Data

US 2010/0240187 A1 Sep. 23, 2010

Related U.S. Application Data

(60) Division of application No. 12/037,452, filed on Feb. 26, 2008, now Pat. No. 7,755,106, which is a continuation of application No. 11/221,241, filed on Sep. 7, 2005, now Pat. No. 7,339,209.

(51) Int. Cl.
*H01L 21/8249* (2006.01)
(52) U.S. Cl. .................... 438/235; 438/309; 438/312
(58) Field of Classification Search .................. 438/235, 438/309, 312
See application file for complete search history.

(56) References Cited

U.S. PATENT DOCUMENTS

| 5,221,638 A | 6/1993 | Ohtsuka et al. |
| 5,278,443 A | 1/1994 | Mori et al. |
| 5,567,961 A | 10/1996 | Usagawa et al. |
| 6,191,015 B1 | 2/2001 | Losehand et al. |
| 6,724,039 B1 | 4/2004 | Blanchard |
| 6,787,910 B2 | 9/2004 | Lee et al. |
| 7,339,209 B2 | 3/2008 | Brar |
| 2001/0016377 A1 | 8/2001 | Mizutani |
| 2004/0119129 A1 | 6/2004 | Giboney |

OTHER PUBLICATIONS

A. Seabaugh et al., "Resonant-tunneling mixed-signal circuit technology", Solid State Electronics, vol. 43, pp. 1355-1365 (1999).

*Primary Examiner* — Eugene Lee
*Assistant Examiner* — Anthony Ho
(74) *Attorney, Agent, or Firm* — McNees Wallace & Nurick LLC

(57) ABSTRACT

An integrated semiconductor structure includes a heterojunction bipolar transistor and a Schottky diode. The structure has a substrate, the heterojunction bipolar transistor overlying and contacting the substrate, wherein the heterojunction bipolar transistor includes a transistor collector layer, and a Schottky diode overlying the substrate and overlying the transistor collector layer. The Schottky diode includes a Schottky diode barrier layer structure that desirably is not of the same material, doping, and thickness as the transistor collector layer.

17 Claims, 2 Drawing Sheets

US 8,043,910 B2

INTEGRATED SEMICONDUCTOR STRUCTURE INCLUDING A HETEROJUNCTION BIPOLAR TRANSISTOR AND A SCHOTTKY DIODE

CROSS REFERENCE TO RELATED APPLICATION

This application is a divisional of and claims the benefit of U.S. Utility application Ser. No. 12/037,452, filed Feb. 26, 2008, entitled "INTEGRATED SEMICONDUCTOR STRUCTURE INCLUDING A HETEROJUNCTION BIPOLAR TRANSISTOR AND A SCHOTTKY DIODE", now allowed, which is a continuation of and claims the benefit of U.S. Utility application Ser. No. 11/221,241, filed Sep. 7, 2005, entitled "INTEGRATED SEMICONDUCTOR STRUCTURE INCLUDING A HETEROJUNCTION BIPOLAR TRANSISTOR AND A SCHOTTKY DIODE", now U.S. Pat. No. 7,339,209. The content of these two patent documents are incorporated herein by reference in their entirety.

FIELD OF THE INVENTION

This invention relates to semiconductor devices and, more particularly, to a structure that integrates a heterojunction bipolar transistor and a Schottky diode.

BACKGROUND OF THE INVENTION

Heterojunction bipolar transistors (HBT) and Schottky diodes are often incorporated into a single semiconductor structure. For example, a Schottky diode may be included in a fast diode sampling bridge in HBT-based mixed-signal circuits. In another example, Schottky diodes may be used for level shifting in the logic core of the circuits.

The usual approach to integrating the HBT and the Schottky diode is to build the Schottky diode from the same epitaxial layers that are used as the collector of the HBT. While such a structure is readily fabricated, it requires the collector material to perform a dual function, which results in a compromise of one or the other function. The common collector materials used for high-speed HBTs make poor Schottky diode barrier layers due to low bandgaps (in InGaAs collectors) or to poor surface Fermi-level pinning and low barrier heights (in InP collectors). The low bandgap collectors have poor breakdown and low turn-on voltages. The poor surface pinning leads to process-dependent barrier heights and to poor uniformity and reproducibility.

The inventor has determined that if the collector material of the HBT is modified to improve the performance of the Schottky diode in such a construction, the transport and breakdown properties of the HBT collector are degraded. The result is that the conventional integrated HBT and Schottky diode has compromised properties that are not optimal for either the HBT or the Schottky diode.

There is a need for an improved approach to the structure of the integrated HBT and Schottky diode that permits the two devices to function together, but allows their separate optimization. The present invention fulfills this need, and further provides related advantages.

SUMMARY OF THE INVENTION

The present approach provides an integrated semiconductor structure including a heterojunction bipolar transistor (HBT) and a Schottky diode, in which the structures and performance of the HBT and the Schottky diode may be separately optimized. The integrated semiconductor structure may be readily fabricated using conventional deposition techniques. External hookup access to both the HBT and the Schottky diode are comparable with those achieved in conventional designs.

In accordance with the invention, an integrated semiconductor structure includes a heterojunction bipolar transistor and a Schottky diode. The semiconductor structure comprises a substrate, and a heterojunction bipolar transistor overlying and contacting the substrate. The heterojunction bipolar transistor includes a transistor collector layer. A Schottky diode overlies the substrate and overlies the transistor collector layer. The Schottky diode includes a Schottky diode barrier layer structure that is not necessarily of the same material, doping, and thickness as the transistor collector layer.

The transistor collector layer may comprise, for example, an InGaAs-based material or an InP-based material. The Schottky diode barrier layer structure may comprise, for example, an InAlAs-based material.

In a preferred construction, the heterojunction bipolar transistor comprises a transistor collector contact layer overlying and contacting the substrate, and a transistor collector ohmic contact to the transistor collector contact layer. The transistor collector layer overlies and contacts the transistor collector contact layer. The heterojunction bipolar transistor further includes a transistor base layer overlying and contacting the transistor collector layer, a transistor base ohmic contact to the transistor base layer, a transistor emitter structure overlying and contacting the transistor base layer, and a transistor emitter ohmic contact overlying and contacting the transistor emitter structure. The preferred construction of the Schottky diode comprises an emitter layer overlying and contacting the transistor base layer, a diode contact layer overlying and contacting the emitter layer, a diode cathode ohmic contact to the diode contact layer, the Schottky diode barrier layer structure overlying and contacting the diode contact layer, and a diode anode contact to the Schottky diode barrier layer structure. The diode cathode may also serve as the emitter contact. The structure of this embodiment is slightly higher than that of the conventional structure, but the height of this embodiment is well within the general height limitations of semiconductor devices.

A key feature of one embodiment of the present approach is that the Schottky diode barrier layer structure of the Schottky diode is not made of the same material as the transistor collector layer. Consequently, the transistor collector layer is not required to preform a dual function in two devices. This allows the structure of the heterojunction bipolar transistor and the structure of the Schottky diode to be separately optimized. The fabrication and performance of the integrated semiconductor device are highly reproducible.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
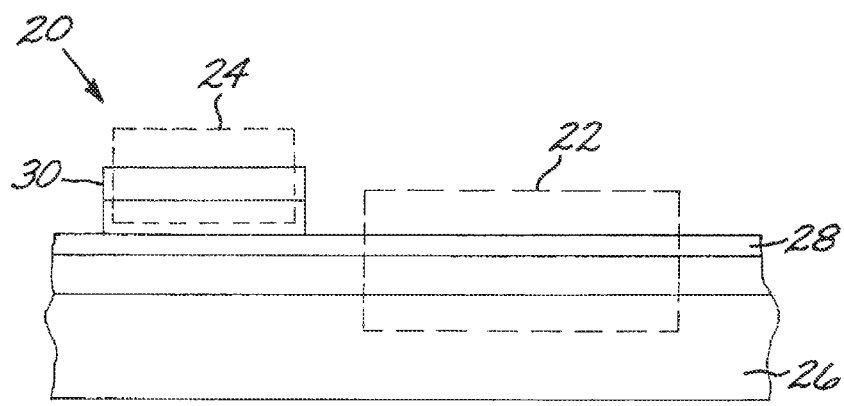
FIG. 1 is a schematic elevational view of an integrated semiconductor structure.

FIG. 1 schematically depicts one embodiment of an integrated semiconductor structure 20 including a heterojunction bipolar transistor (HBT) 22 and a Schottky diode 24, but not showing the external contacts for these devices. The semiconductor structure 20 comprises a substrate 26 and the heterojunction bipolar transistor 22 overlying and contacting the substrate 26. (The heterojunction bipolar transistor 22 may include some of the substrate 26.) The heterojunction bipolar transistor 22 includes a transistor collector layer 28. The integrated semiconductor structure 20 further includes the Schottky diode 24 overlying the substrate 26 and overlying the transistor collector layer 28. The Schottky diode 24 includes a Schottky diode barrier layer structure 30 that is not made of the same material as the transistor collector layer 28. Stated alternatively, the Schottky diode barrier layer structure 30 and the transistor collector layer 28 are not made of the same layer(s) or materials.

Figure 2:
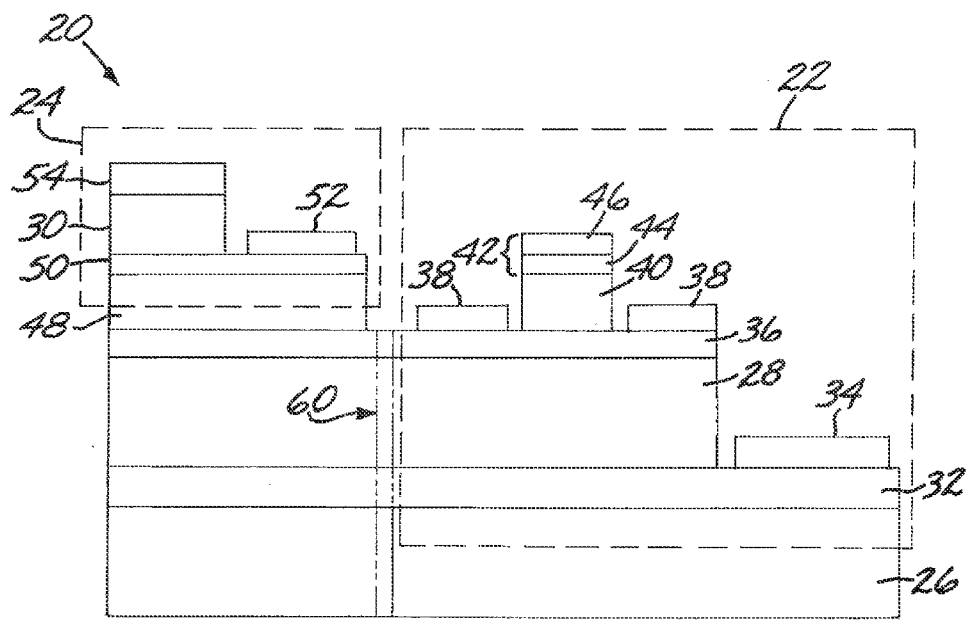
FIG. 2 is a schematic elevational view of an integrated semiconductor structure depicting the layered construction.

FIG. 2 depicts in greater detail a preferred embodiment of the integrated semiconductor structure 20 of FIG. 1. In FIG. 2, elements already described in relation to FIG. 1 are assigned the same reference numerals, and the prior description is incorporated here.

The heterojunction bipolar transistor 22 includes a transistor collector contact layer 32 (which also may be termed a "sub-collector") overlying and contacting the substrate 26, and a metallic transistor collector ohmic contact 34 to the transistor collector contact layer 32. The transistor collector ohmic contact 34, like all of the contacts discussed herein, provides an external electrical connection to the described structure. The transistor collector layer 28 overlies and contacts the transistor collector contact layer 32. A transistor base layer 36 overlies and contacts the transistor collector layer 28. A metallic transistor base ohmic contact 38 is provided to the transistor base layer 36. A transistor emitter structure 40 overlies and contacts the transistor base layer 36, and a transistor emitter ohmic contact 42 overlies and contacts the transistor emitter structure 40. The transistor emitter ohmic contact 42 includes a transistor emitter contact layer 44 overlying and contacting the transistor emitter structure 40, and a metallic emitter contact layer 46 overlying and contacting the transistor emitter contact layer 44.

In this embodiment, the Schottky diode 24 comprises an emitter layer 48 (which is preferably the same material and thickness as the transistor emitter structure 40) overlying and contacting the transistor base layer 36, and a diode contact layer 50 (which is preferably the same material and thickness as the transistor emitter contact layer 44) overlying and contacting the emitter layer 48. A metallic diode cathode ohmic contact 52 is deposited on and provides external electrical contact to the diode contact layer 50. The Schottky diode barrier layer structure 30 overlies and contacts the diode contact layer 50. A metal-semiconductor diode contact 54 is provided to the Schottky diode barrier layer structure 30.

The Schottky diode barrier layer structure 30 of the Schottky diode 24 is a separate and distinct material and structure from the transistor collector layer 28. There may optionally be provided an isolator 60 to electrically isolate the Schottky diode 24 from the heterojunction bipolar transistor 22. The isolator 60 may be, for example, a physical gap or a layer of an electrically insulating material.

Figure 3:
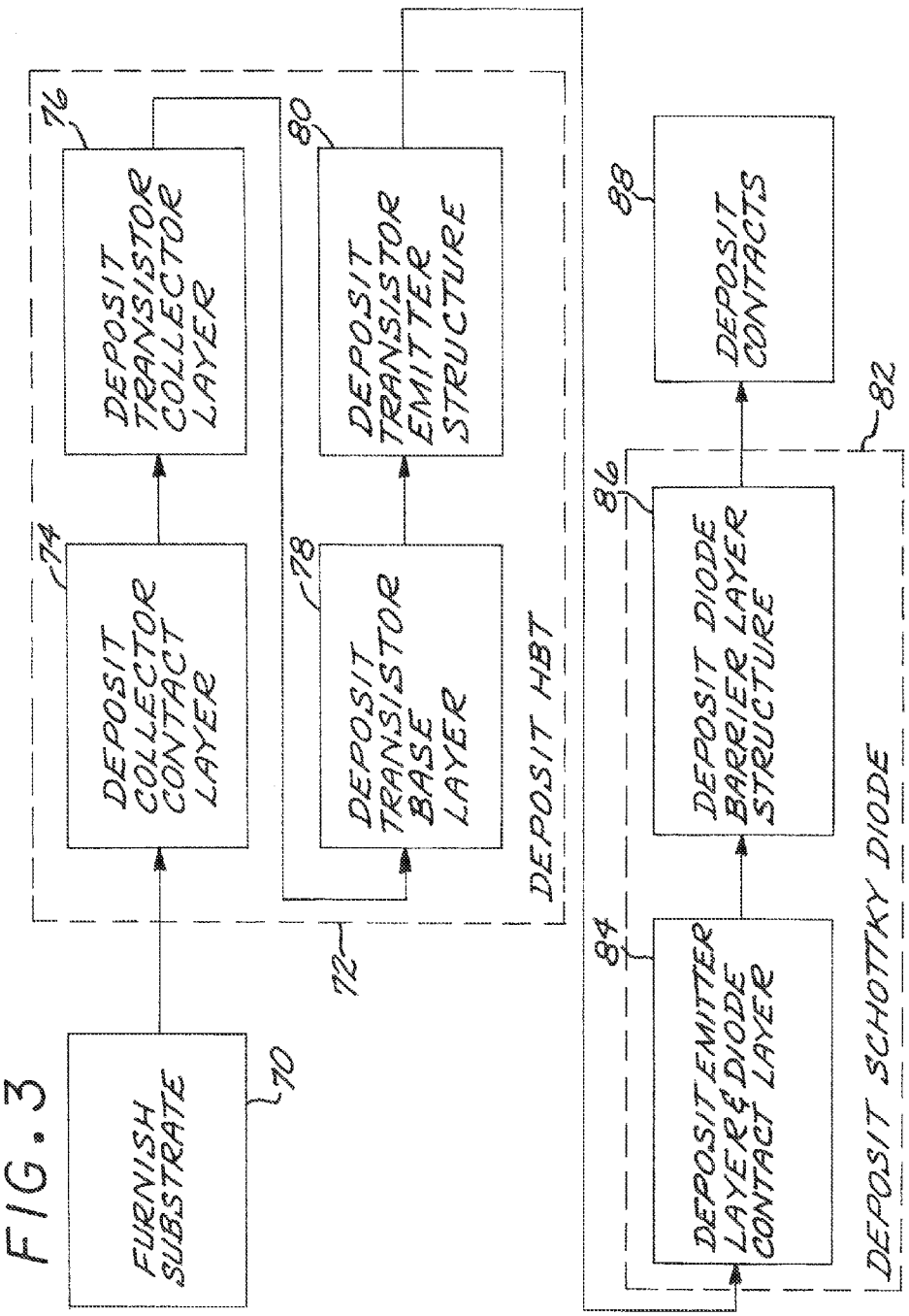
FIG. 3 is a block flow diagram of an approach for fabricating the integrated semiconductor structure.

FIG. 3 depicts an embodiment of a method for preparing the integrated semiconductor structure 20. In discussing the steps of this method, some preferred materials and layer thicknesses will be set forth, but these are presented as preferred and not limiting of the materials and layer thicknesses.

The substrate 26 is furnished, step 70. A preferred substrate is indium phosphide, InP.

The heterojunction bipolar transistor 22 is thereafter deposited overlying a portion of and in contact with the substrate 26, step 72, in a series of substeps. The transistor collector contact layer 32 is deposited overlying a portion of and in contact with the substrate 26, step 74. The transistor collector contact layer 32 is preferably n+-doped InP having a thickness of from about 100 to about 500 nanometers, preferably about 400 nanometers thick. The transistor collector layer 28 is thereafter deposited overlying a portion of and in contact with the transistor collector contact layer 32, step 76. The transistor collector layer 28 is preferably a graded structure doped—and having a thickness of about 50 to about 1000 nanometers of InP, and preferably about 150 nanometers thickness of InP, about 10 to about 100 nanometers thickness of InGaAlAs, preferably about 25 nanometers thickness of InGaAlAs, overlying the InP, and about 10 to about 100 nanometers thickness of InGaAs, preferably about 25 nanometers thickness of InGaAs, overlying the InGaAlAs. This graded structure is selected to match the conduction band of the InP and the conduction band of the overlying InGaAs transistor base layer 36. The transistor base layer 36 is thereafter deposited overlying a portion of and in contact with the transistor collector layer 28, step 78. The transistor base layer 36 is preferably InGaAs having a thickness of about 50 to about 150 nanometers, preferably a thickness of about 50 nanometers. The transistor emitter structure 40 is thereafter deposited overlying a portion of and in contact with the transistor base layer 36, step 80. The transistor emitter structure 40 is preferably InP doped—and a thickness of about 10 to about 150 nanometers, preferably a thickness of about 20 nanometers. Usually at this point, the transistor emitter contact layer 44 is deposited overlying a portion of and in contact with the transistor emitter structure 40. The transistor emitter contact layer 44 is preferably n+-doped InGaAs about 50 nanometers thick.

The Schottky diode 24 is deposited overlying a portion of and in contact with the heterojunction bipolar transistor 22, step 82, in a series of substeps. The emitter layer 48, which is preferably the same material and thickness as the transistor emitter structure 40, is deposited overlying a portion of and in contact with the transistor base layer 36, step 84. Where the emitter layer 48 and the transistor emitter structure 40 are the same material, these two layers may be deposited at the same time as part of step 72. The diode contact layer 50, which is preferably the same material and thickness as the transistor emitter contact layer 44, is thereafter deposited overlying a portion of and in contact with the layer 48, step 84. Where the diode contact layer 50 is the same material as the transistor emitter contact layer 44, these two layers may be deposited at the same time as part of step 72. The Schottky diode barrier layer structure 30 is thereafter deposited overlying a portion of and in contact with the diode contact layer 50. The Schottky diode barrier layer structure 30 is preferably InP doped—and about 100 to about 1000 nanometers thick, preferably about 200 nanometers thick, with an overlying layer of InGaAs from about 1 to about 20 nanometers thick, preferably about 5 nanometer thick. An advantage of the present approach is that the Schottky diode barrier layer structure 30 and the transistor collector layer 28 are embodied in different layers, so that they can be different materials with different doping if desired.

The contacts 34, 38, 46, 52, and 54 are thereafter deposited, step 88. The ohmic contacts 34, 38, 46, and 52 are typically a layer of AuGeNi about 50 to about 150 nanometers thick, preferably about 80 nanometers thick, with an overlying layer of Au about 100 to about 1000 nanometers thick, preferably about 150 nanometers thick. These layers are later heated and annealed to interdiffuse them and the underlying semiconductor material. The contacts 34, 38, 46, and 52 are normally all deposited at the same time and at the conclusion of the deposition of the heterojunction bipolar transistor 22, step 72, and the deposition of the Schottky diode 24, step 82, for convenience. The diode contact 54 is a metal-semiconductor contact, and is not an ohmic contact.

All of the deposition steps 74, 76, 78, 80, 84, 86, and 88 are performed by any operable approach, with vacuum vapor deposition being preferred.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for preparing an integrated semiconductor structure including a heterojunction bipolar transistor and a Schottky diode, the method including the steps of
providing a substrate;
depositing the heterojunction bipolar transistor overlying and contacting the substrate, wherein the heterojunction bipolar transistor includes a transistor collector layer; and
depositing the Schottky diode overlying the substrate and overlying the transistor collector layer;
wherein the heterojunction bipolar transistor is formed by depositing:
a transistor collector contact layer overlying and contacting the substrate,
a transistor collector ohmic contact to the transistor collector contact layer,
the transistor collector layer overlying and contacting the transistor collector contact layer,
a transistor base layer overlying and contacting the transistor collector layer,
a transistor base ohmic contact to the transistor base layer,
a transistor emitter structure overlying and contacting the transistor base layer, and
a transistor emitter ohmic contact overlying and contacting the transistor emitter structure; and
wherein the Schottky diode is formed by depositing:
an emitter layer overlying and contacting the transistor base layer,
a diode contact layer overlying and contacting the emitter layer,
a diode cathode ohmic contact to the diode contact layer,
the Schottky diode barrier layer structure overlying and contacting the diode contact layer, and
a diode anode contact to the Schottky diode barrier layer structure; and
wherein the Schottky diode barrier layer structure is not formed of the same material as the transistor collector layer.

2. The method of claim 1, wherein the Schottky diode barrier layer structure is not of the same material, doping, and thickness as the transistor collector layer.

3. The method of claim 1, wherein the Schottky diode barrier layer structure is not of the same doping as the transistor collector layer.

4. The method of claim 1, wherein the Schottky diode barrier layer structure is not of the same thickness as the transistor collector layer.

5. The method of claim 1, wherein the substrate is an InP-based substrate.

6. The method of claim 1, wherein the Schottky diode barrier layer is a InAlAs-based material.

7. The method of claim 1, wherein the transistor collector layer comprises an InGaAs-based or an InP-based material.

8. A method for preparing an integrated semiconductor structure, the method comprising the steps of:
providing a substrate;
depositing a transistor collector layer overlying and in contact with the substrate;
depositing a Schottky diode barrier layer structure overlying the transistor collector layer;
wherein the Schottky diode is formed by depositing:
an emitter layer overlying and contacting the transistor base layer,
a diode contact layer overlying and contacting the emitter layer,
a diode cathode ohmic contact to the diode contact layer,
the Schottky diode barrier layer structure overlying and contacting the diode contact layer, and
a diode anode contact to the Schottky diode barrier layer structure; and
wherein the Schottky diode barrier layer structure is not formed of the same material as the transistor collector layer.

9. The method of claim 8, wherein the Schottky diode barrier layer structure is not of the same doping as the transistor collector layer.

10. The method of claim 8, wherein the Schottky diode barrier layer structure is not of the same thickness as the transistor collector layer.

11. The method of claim 8, further comprising depositing a transistor collector contact layer overlying and in contact with the substrate.

12. The method of claim 8, wherein the substrate is an InP-based substrate.

13. The method of claim 8, wherein the Schottky diode barrier layer is a InAlAs-based material.

14. The method of claim 8, wherein depositing the heterojunction bipolar transistor layer comprises depositing a transistor base layer overlying and contacting the transistor collector layer.

15. The method of claim 8, wherein the transistor collector layer comprises an InGaAs-based or an InP-based material.

16. The method of claim 8, further comprising:
depositing a transistor base layer overlying and contacting the transistor collector layer.

17. The method of claim 16, further comprising:
depositing an emitter layer overlying and contacting the transistor base layer.

* * * * *